US012677464B2

(12) United States Patent
Chen et al.

(10) Patent No.: US 12,677,464 B2
(45) Date of Patent: Jul. 7, 2026

(54) SEMICONDUCTOR DEVICES HAVING VERTICAL FIELD EFFECT TRANSISTORS

(71) Applicant: TAIWAN SEMICONDUCTOR MANUFACTURING COMPANY LTD., Hsinchu (TW)

(72) Inventors: Yi-Yi Chen, Keelung City (TW); Chi-Yu Lu, New Taipei City (TW); Chih-Liang Chen, Hsinchu City (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 556 days.

(21) Appl. No.: 18/313,368

(22) Filed: May 7, 2023

(65) Prior Publication Data

US 2024/0371949 A1    Nov. 7, 2024

(51) Int. Cl.
| | |
|---|---|
| *H10D 30/63* | (2025.01) |
| *H10D 30/01* | (2025.01) |
| *H10D 64/23* | (2025.01) |
| *H10D 84/01* | (2025.01) |
| *H10D 84/03* | (2025.01) |
| *H10D 84/83* | (2025.01) |

(52) U.S. Cl.
CPC ......... *H10D 64/252* (2025.01); *H10D 30/025* (2025.01); *H10D 30/63* (2025.01); *H10D*

*84/0149* (2025.01); *H10D 84/016* (2025.01); *H10D 84/038* (2025.01); *H10D 84/83* (2025.01)

(58) Field of Classification Search
CPC .... H10D 30/63; H10D 30/025; H10D 84/016; H10D 84/038; H10D 84/83; H10D 84/0149
See application file for complete search history.

(56) References Cited

U.S. PATENT DOCUMENTS

2023/0060784 A1* 3/2023 Liu .................... H10D 84/0158

* cited by examiner

*Primary Examiner* — Mark V Prenty
(74) *Attorney, Agent, or Firm* — WPAT LAW; Anthony King

(57) ABSTRACT

A semiconductor structure includes a first upper source/drain region, a second upper source/drain region, a first lower source/drain contact, a second lower source/drain contact, and a third conductive region. The first upper source/drain contact is disposed at a first elevation. The second upper source/drain contact is disposed at the first elevation. The first lower source/drain contact is disposed at a second elevation. The second lower source/drain contact is disposed at the second elevation. The third conductive region is disposed at a third elevation. A projection area of the third conductive region is disposed between a projection area of the first upper source/drain contact and a projection area of the second upper source/drain contact. The third elevation is disposed between the first elevation and the second elevation.

20 Claims, 17 Drawing Sheets

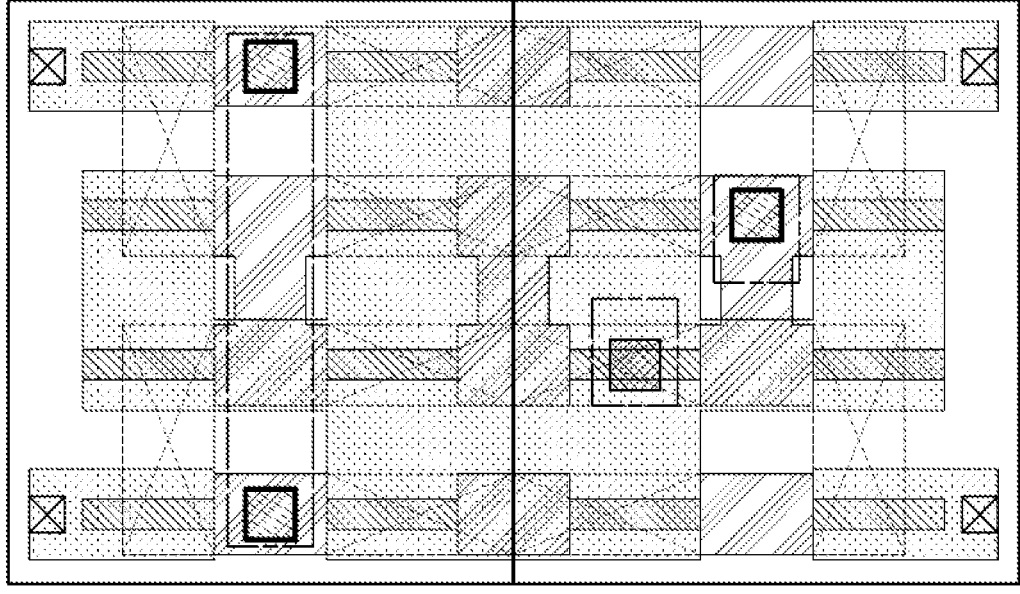
FIG. 9A
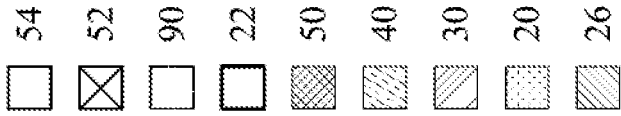
54
52
90
22
50
40
30
20
26

1000

1001　Forming a lower source/drain contact layer

1002　Forming an active/doped region layer attached to the lower source/drain contact layer 1003　Forming a metal gate layer surrounding a portion of the active/doped region layer and forming a conductive region layer 1004　Forming an upper source/drain contact layer on the active/doped region layer

SEMICONDUCTOR DEVICES HAVING VERTICAL FIELD EFFECT TRANSISTORS

TECHNICAL FIELD

The present disclosure relates in general, to semiconductor devices. Specifically, the present disclosure relates to semiconductor devices having vertical field effect transistor (VFET) structures.

BACKGROUND

A problem faced by existing process is the difficulty in forming double height or multi-height vertical metal structures for interconnection. To reduce cell area of the semiconductor structure and increase flexibility of the layout, an improved VFET structure is called for.

BRIEF DESCRIPTION OF THE DRAWINGS

Aspects of the embodiments of the present disclosure are best understood from the following detailed description when read with the accompanying figures. It should be noted that, in accordance with the standard practice in the industry, various structures are not drawn to scale. In fact, the dimensions of the various structures may be arbitrarily increased or reduced for clarity of discussion.

FIG. 9A is a schematic layout diagram of semiconductor structures in accordance with some embodiments of the present disclosure.

DETAILED DESCRIPTION

Figure 1A:
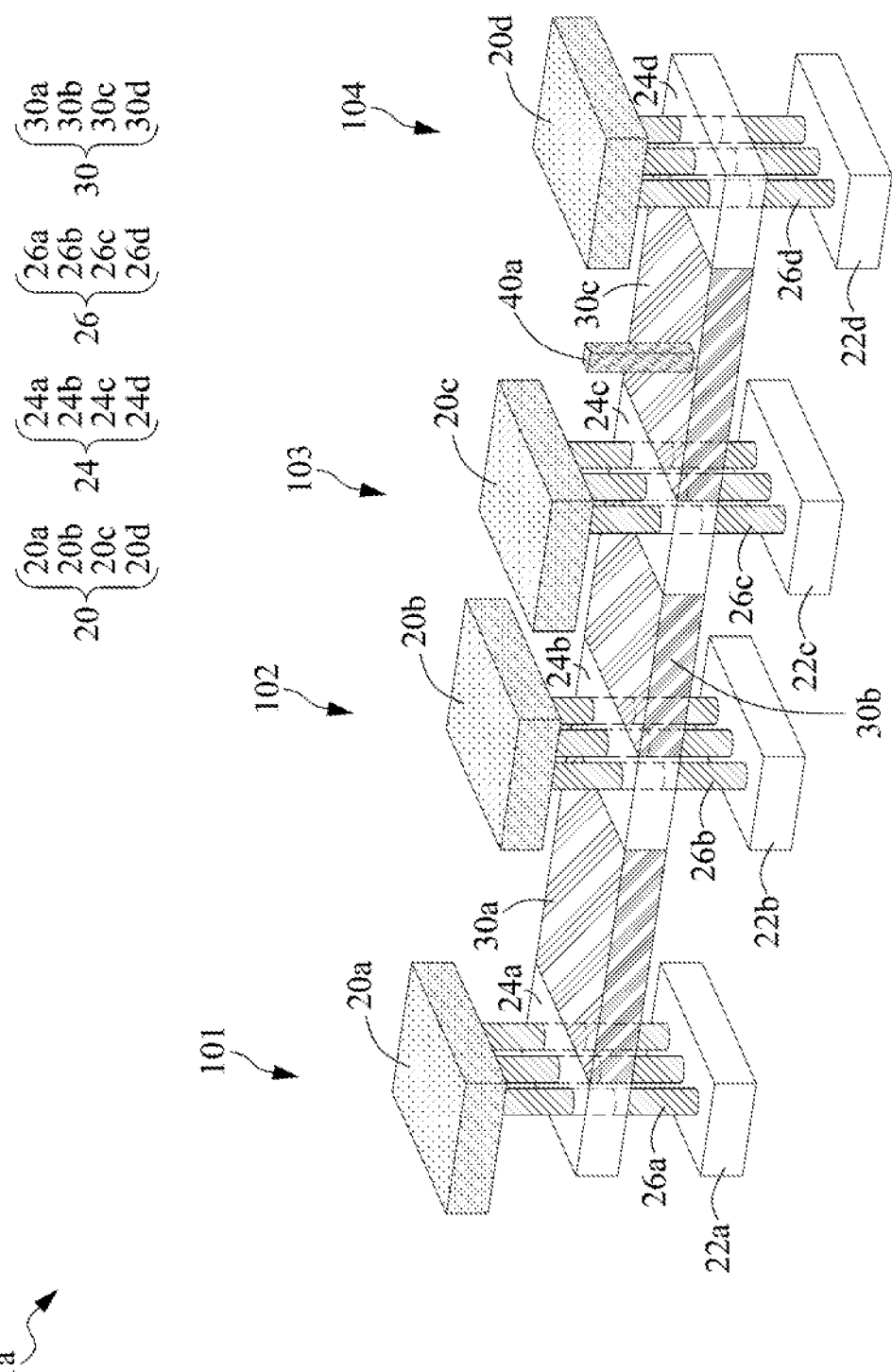
FIG. 1A is a perspective view of semiconductor structures in accordance with some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90° (degree) or at other orientations) and the spatially relative descriptors used herein may likewise be interpreted accordingly.

As used herein, although terms such as "first," "second" and "third" describe various elements, components, regions, layers and/or sections, these elements, components, regions, layers and/or sections should not be limited by these terms. These terms may only be used to distinguish one element, component, region, layer or section from another. Terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" and "about" generally mean within a value or range that can be contemplated by people having ordinary skill in the art. Alternatively, the terms "substantially," "approximately" and "about" mean within an acceptable standard error of the mean when considered by one of ordinary skill in the art. People having ordinary skill in the art can understand that the acceptable standard error may vary according to different technologies.

Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

A problem faced by existing process is the difficulty in forming double height or multi-height vertical metal structures for interconnection. To reduce cell area of the semiconductor structure and increase flexibility of the layout, an improved VFET structure is called for.

Some exemplary embodiments of semiconductor structures formation are disclosed as follows. The semiconductor structures include (a) a projection area of the conductive region 30a disposed between a projection area of the upper source/drain contact 20a and a projection area of the upper source/drain contact 20b; (b) the conductive region 30b contacting and electrically connected to the metal gates 24b and 24c; (c) the upper source/drain contact 20a is in contact with the upper source/drain contact 20b through metal feature 201; and (d) at least two of a lateral width W1 of the upper source/drain contact 20a, a lateral width W2 of the upper source/drain contact 20b, a lateral width W3 of the upper source/drain contact 20c, and a lateral width W4 of the upper source/drain contact 20d differing from each other from a top view.

FIG. 1A is a perspective view of semiconductor structures 1a in accordance with some embodiments of the present disclosure. The semiconductor structures 1a include a first vertical field effect transistor (VFET) structure 101, a second VFET structure 102, a third VFET structure 103, and a fourth VFET structure 104. In some embodiments, the first VFET structure 101, the second VFET structure 102, the third VFET structure 103, and the fourth VFET structure 104 are similar in their structures.

In some embodiments, the first VFET structure 101 includes an upper source/drain contact 20a, an active/doped region 26a, a metal gate 24a, and a lower source/drain contact 22a. In some embodiments, the active/doped region may be source/drain. The word "region" referred in the present disclosure can also be referred to as a structure or a layer. In some embodiments, the upper source/drain contact 20a and lower source/drain contact 22a include a source/drain contact formed of metals or other suitable conductive materials. The metal gate 24a includes conductive material, such as aluminum (Al), copper (Cu), tungsten (W), titanium (Ti), tantalum (Ta), or other applicable materials. In some embodiments, the metal gate 24a includes a work function layer. The work function layer is made of metal material, and the metal material includes N-work-function metal or P-work-function metal. The N-work-function metal includes tungsten (W), copper (Cu), titanium (Ti), silver (Ag), aluminum (Al), titanium aluminum alloy (TiAl), titanium aluminum nitride (TiAlN), tantalum carbide (TaC), tantalum carbon nitride (TaCN), tantalum silicon nitride (TaSiN), manganese (Mn), zirconium (Zr) or a combination thereof. The P-work-function metal includes titanium nitride (TiN), tungsten nitride (WN), tantalum nitride (TaN), ruthenium (Ru) or a combination thereof. Other suitable materials are within the contemplated scope of the disclosure.

In some embodiments, the upper source/drain contacts 20a-20d constitute an upper source/drain contact 20. The upper source/drain contact 20 is disposed at the first elevation. In some embodiments, the lower source/drain contacts 22a-22d constitute a lower source/drain contact 22. The lower source/drain contact 22 is disposed at the second elevation. The conductive regions 30a-30c constitute a conductive region layer 30. The conductive region layer 30 is disposed at a third elevation. The third elevation is disposed between the first elevation and the second elevation along a vertical orientation.

In some embodiments, for an N-type VFET, the epitaxial semiconductor material of the active/doped region 26a adjacent to the upper source/drain contact 20a and lower source/drain contact 22a can be silicon or silicon carbide (SiC), which will enhance majority charge carrier mobility within the N-type VFET's. In some embodiments, the active/doped region 26a includes a semiconductor material such as silicon and is surrounded by a gate dielectric layer (not shown). The gate dielectric layer may be conformally deposited over the semiconductor material of the active/doped region 26a. In some embodiments, the active/doped region 26a includes an active region. In some embodiments, the active/doped region 26a includes a gate dielectric layer (not shown) contacting the metal gate 24a. The gate dielectric layer includes silicon oxide ($SiO_x$), silicon nitride ($Si_xN_y$), silicon oxynitride (SiON), or a combination thereof. The gate dielectric layer includes dielectric material(s), such as high-k dielectric material. The high-k dielectric material has a dielectric constant (k value) greater than 4. The high-k material includes hafnium oxide ($HfO_2$), zirconium oxide ($ZrO_2$), lanthanum oxide ($La_2O_3$), yttrium oxide ($Y_2O_3$), aluminum oxide ($Al_2O_3$), titanium oxide ($TiO_2$) or another applicable material.

In some embodiments, the active/doped region 26a contacts the upper source/drain contact 20a and the lower source/drain contact 22a. In some embodiments, the upper source/drain contact 20a is disposed at a first elevation and the upper source/drain contact 20b is disposed at the first elevation. The lower source/drain contact 22a is disposed at a second elevation and the lower source/drain contact 22b is disposed at the second elevation. A conductive region 30a is disposed at a third elevation. A projection area of the conductive region 30a is disposed between a projection area of the upper source/drain contact 20a and a projection area of the upper source/drain contact 20b. The third elevation is disposed between the first elevation and the second elevation. A projection area of the conductive region 30b is disposed between a projection area of the upper source/drain contact 20b and a projection area of the upper source/drain contact 20c. A projection area of the conductive region 30c is disposed between a projection area of the upper source/drain contact 20c and a projection area of the upper source/drain contact 20d. The area of the semiconductor structures 1a may be reduced by adding the conductive region layer 30 without effecting the functions of the semiconductor structures 1a.

In some embodiments, a projection area of the conductive region 30a is disposed between a projection area of the lower source/drain contact 22a and a projection area of the lower source/drain contact 22b. A projection area of the conductive region 30b is disposed between a projection area of the lower source/drain contact 22b and a projection area of the lower source/drain contact 22c. A projection area of the conductive region 30c is disposed between a projection area of the lower source/drain contact 22c and a projection area of the lower source/drain contact 22d. An elevation of the conductive region 30a is disposed below an elevation of the upper source/drain contact 20a and the upper source/drain contact 20b.

In some embodiments, the conductive region 30a is disposed between the first elevation and the second elevation. The projection area of the conductive region 30a is disposed between a projection area of the lower source/drain contact 22a and a projection area of the lower source/drain contact 22b. The upper source/drain contact 20a overlaps with the lower source/drain contact 22a from a top view.

In some embodiments, metal gates 24a, 24b, 24c, and 24d are disposed at the third elevation. In some embodiments, the metal gate 24a contacts the active/doped region 26a and surrounds a portion of the active/doped region 26a. A second VFET structure 102 comprises an upper source/drain contact 20b and a lower source/drain contact 22b. The second VFET structure 102 is adjacent to the first VFET structure 101. A third VFET structure 103 is adjacent to the second VFET structure 102. The third VFET structure 103 comprises an upper source/drain contact 20c and a lower source/drain contact 22c. A fourth VFET structure 104 is adjacent to the third VFET structure 103. The fourth VFET structure 104 comprises an upper source/drain contact 20d and a lower source/drain contact 22d.

The metal gates 24a, 24b, 24c, and 24d constitute a metal gate layer 24. In some embodiments, the metal gates 24a, 24b, 24c, and 24d include copper (Cu), or aluminum (Al), an alloy thereof (such as AlCu), or other suitable conductive materials. In some embodiments, the metal gate 24a contacts and is electrically connected to the conductive region 30a. The metal gate 24b contacts and is electrically connected to the conductive region 30a. In some embodiments, the conductive region 30b contacts and is electrically connected to the metal gates 24b and 24c. The conductive region 30c contacts and is electrically connected to the metal gates 24c and 24d. In some embodiments, conductive regions 30a-30c include polysilicon or other suitable conductive materials.

In some embodiments, the second VFET structure 102 is adjacent to the first VFET structure 101. The second VFET structure 102 and the first VFET structure 101 are in contact with the conductive region 30a. The conductive region 30a contacts the metal gate 24a of the first VFET structure 101 and the metal gate 24b of the second VFET structure 102. The conductive region 30b contacts the metal gate 24b of the second VFET structure 102 and the metal gate 24c of the third VFET structure 103. The conductive region 30c contacts the metal gate 24c of the third VFET structure 103 and the metal gate 24d of the fourth VFET structure 104.

In some embodiments, the third VFET structure 103 is adjacent to the second VFET structure 102. The second VFET structure 102 and the third VFET structure 103 are configured to be controlled by a conductive region 30b disposed between the third VFET structure 103 and the second VFET structure 102. The conductive region 30b is disposed at a third elevation. In some embodiments, the third VFET structure 103 and the fourth VFET structure 104 are configured to be controlled by a conductive region 30c. In some embodiments, a signal is transmitted to the conductive via 40a to control the first VFET structure 101, the second VFET structure 102, the third VFET structure 103, and the fourth VFET structure 104. In some embodiments, the conductive via 40a includes polysilicon or other suitable conductive materials.

Figure 1B:
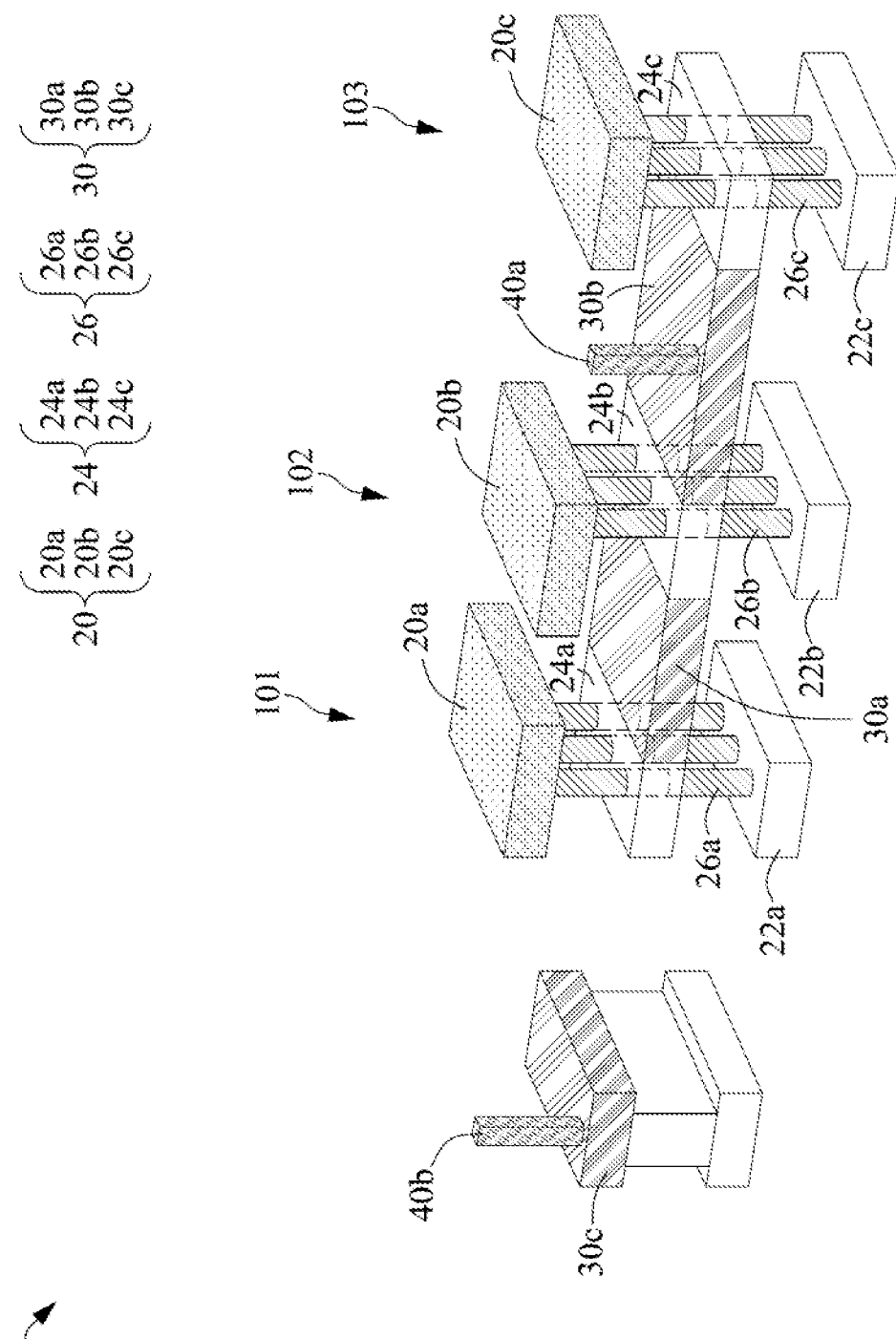
FIG. 1B is a perspective view of semiconductor structures in accordance with some embodiments of the present disclosure.

FIG. 1B is a perspective view of semiconductor structures 1b in accordance with some embodiments of the present disclosure. The semiconductor structures 1b are similar to the semiconductor structures 1a, differing in the lack of the fourth VFET structure 104. In some embodiments, the third VFET structure 103 and the second VFET structure 102 are configured to be controlled by a conductive region 30b. In some embodiments, a signal is transmitted to the conductive via 40a to control the first VFET structure 101, the second VFET structure 102, and the third VFET structure 103. In some embodiments, conductive vias 40a and 40b include polysilicon or other suitable conductive materials.

Figure 1C:
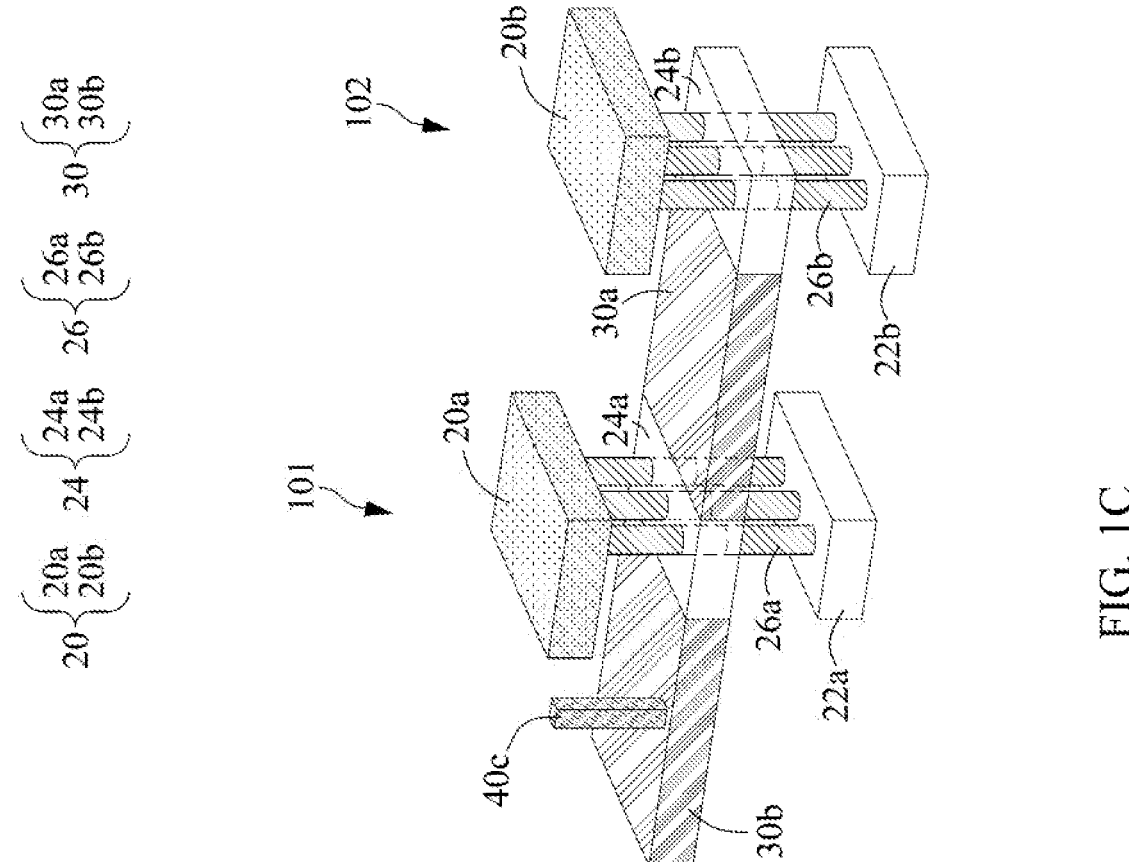
FIG. 1C is a perspective view of semiconductor structures in accordance with some embodiments of the present disclosure.
Figure 1C:

FIG. 1C is a perspective view of semiconductor structures 1c in accordance with some embodiments of the present disclosure. The semiconductor structures 1c are similar to the semiconductor structures 1a, differing in the lack of third and fourth VFET structures 103 and 104. In some embodiments, the first VFET structure 101 and the second VFET structure 102 are configured to be controlled by a conductive region 30b. In some embodiments, a signal is transmitted to the conductive via 40c to control the first VFET structure 101 and the second VFET structure 102. In some embodiments, a conductive via 40c includes polysilicon or other suitable conductive materials.

Figure 2:
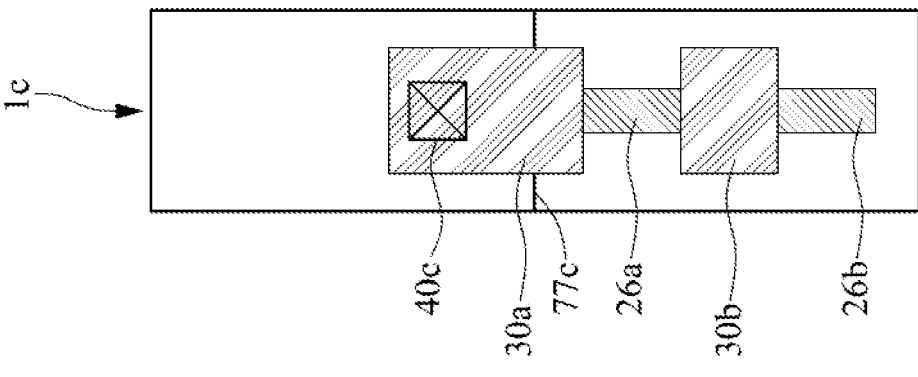
FIG. 2 is a top view of a layout of semiconductor structures in accordance with some embodiments of the present disclosure.
Figure 2:
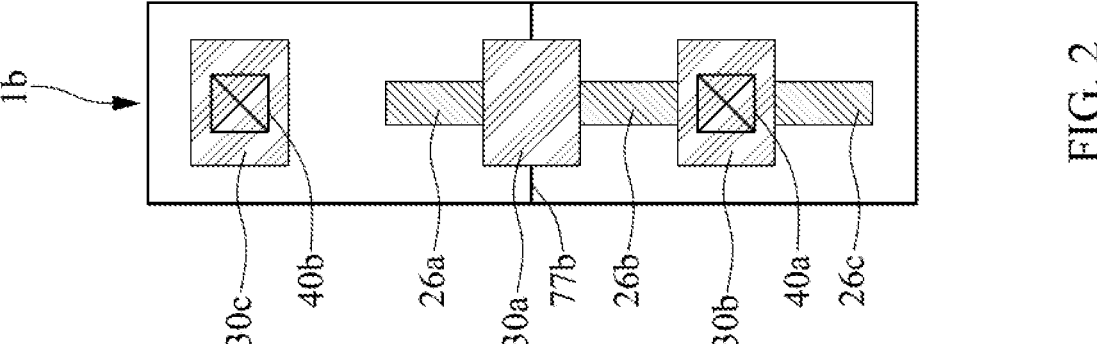
Figure 2:
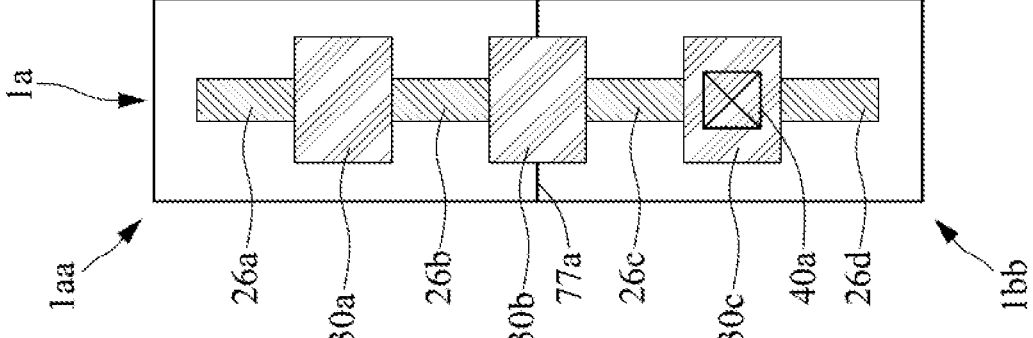

FIG. 2 is a top view of a layout of semiconductor structures 1a-1c in accordance with some embodiments of the present disclosure. In some embodiments, the semiconductor structures 1a-1c respectively include two cells 1aa and 1bb. The conductive region 30b is disposed on the boundary 77a of the two cells of the semiconductor structures 1a from a top view. In some embodiments, the conductive region 30a is disposed on the boundary 77b of the two cells 1aa and 1bb of the semiconductor structures 1b from a top view. The conductive region 30a is disposed on the boundary 77c of the two cells 1aa and 1bb of the semiconductor structures 1c from a top view. The active/doped region 26a of the semiconductor structures 1a is electrically connected to the active/doped region 26b of the semiconductor structures 1a through the conductive region 30a. The active/doped region 26b of the semiconductor structures 1a is electrically connected to the active/doped region 26c of the semiconductor structures 1a through the conductive region 30b. The active/doped region 26c of the semiconductor structures 1a is electrically connected to the active/doped region 26d of the semiconductor structures 1a through the conductive region 30c. In some embodiments, a signal is transmitted to the conductive via 40a of the semiconductor structures 1a to control the active/doped regions 26a-26d.

In some embodiments, the active/doped region 26a of the semiconductor structures 1b is electrically connected to the active/doped region 26b of the semiconductor structures 1b through the conductive region 30a. The active/doped region 26b of the semiconductor structures 1b is electrically connected to the active/doped region 26c of the semiconductor structures 1b through the conductive region 30b. In some embodiments, a signal is transmitted to the conductive via 40b of the semiconductor structures 1b to control the active/doped regions 26a-26c.

In some embodiments, the active/doped region 26a of the semiconductor structures 1c is electrically connected to the active/doped region 26b of the semiconductor structures 1c through the conductive region 30b. In some embodiments, a signal is transmitted to the conductive via 40c of the semiconductor structures 1 to control the active/doped regions 26a and 26b. In some embodiments, the conductive vias 40a-40c include polysilicon or other suitable conductive materials.

Figure 3:
FIG. 3 is a top view of various types of upper source/drain layers of semiconductor structures in accordance with some embodiments of the present disclosure.

FIG. 3 is a top view 3 of various types of upper source/drain contacts 20 of semiconductor structures in accordance with some embodiments of the present disclosure. In some embodiments, there are two rows R1 and R2 (including upper source/drain contacts 20a and 20b) of a plurality of upper cells from a top view. In some embodiments, there are two rows R3 and R4 of a plurality of lower cells (including upper source/drain contacts 20c and 20d) from a top view. The upper source/drain contacts 20 include four upper source/drain contacts 20a-20d. In some embodiments, the upper source/drain contact 20a contacts the upper source/drain contact 20b through metal feature 201. The material of the metal feature 201 is the same as the material of the upper source/drain contact 20a and 20b. The upper source/drain contact 20b contacts the upper source/drain contact 20c through metal feature 202. The upper source/drain contact 20c contacts the upper source/drain contact 20d from a top view through metal feature 203. The area of the semiconductor structures may be reduced by using the upper source/drain contacts 20 (including metal features 201-203) without effecting the functions of the semiconductor structures.

In some embodiments, the four upper source/drain contacts 20a-20d respectively include four lateral widths W1-W4. In some embodiments, at least two of a lateral width W1 of the upper source/drain contact 20a, a lateral width W2 of the upper source/drain contact 20b, a lateral width W3 of the upper source/drain contact 20c, and a lateral width W4 of the upper source/drain contact 20d are different from each other from a top view. In some embodiments, the lateral width W1 is the same as the lateral width W2. In some embodiments, the lateral width W3 is the same as the lateral width W4. In some embodiments, the lateral width W1 is the same as the lateral width W3. In some embodiments, the lateral width W2 is the same as the lateral width W4.

Figure 4:
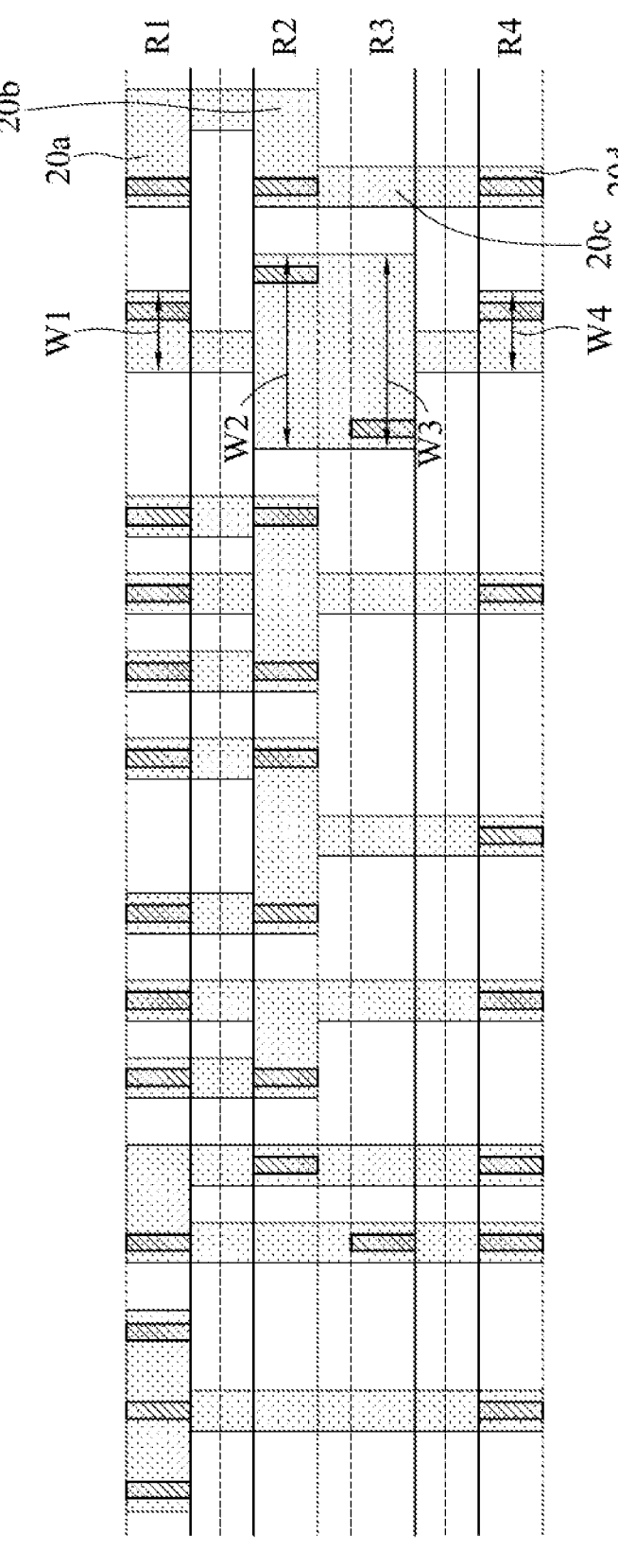
FIG. 4 is a top view of various types of upper source/drain layers of semiconductor structures in accordance with some embodiments of the present disclosure.
Figure 4:

FIG. 4 is a top view of a combination 4 of upper source/drain contacts 20 of semiconductor structures in accordance with some embodiments of the present disclosure. In some embodiments, there are two rows R1 and R2 (including upper source/drain contacts 20a and 20b) of the upper cells from a top view and there are two rows R3 and R4 of the lower cells (including upper source/drain contacts 20c and 20d) from a top view. The upper source/drain contacts 20 includes four upper source/drain contacts 20a-20d. In some embodiments, the upper source/drain contact 20a contacts the upper source/drain contact 20b through metal feature 201. The upper source/drain contact 20b contacts the upper source/drain contact 20c through metal feature 202. The upper source/drain contact 20c contacts the upper source/drain contact 20d from a top view through metal feature 203. In some embodiments, the four upper source/drain contacts 20a-20d respectively include four lateral widths W1-W4. In some embodiments, at least two of a lateral width W1 of the upper source/drain contact 20a, a lateral width W2 of the upper source/drain contact 20b, a lateral width W3 of the upper source/drain contact 20c, and a lateral width W4 of the upper source/drain contact 20d are different from each other from a top view. In some embodiments, the lateral width W1 is the same as the lateral width W2. In some embodiments, the lateral width W3 is the same as the lateral width W4. In some embodiments, the lateral width W1 is the same as the lateral width W3. In some embodiments, the lateral width W2 is the same as the lateral width W4.

Figure 5:
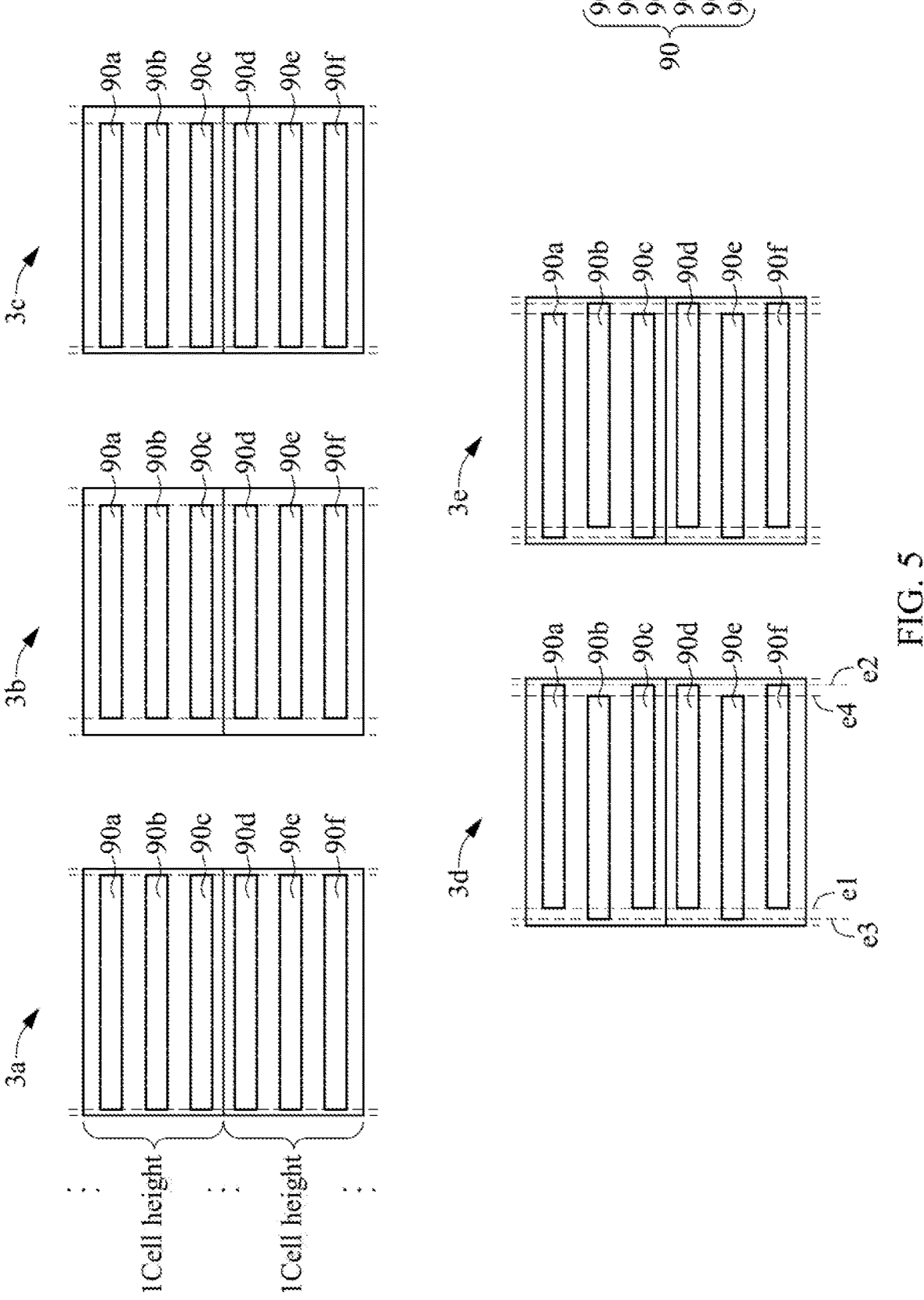
FIG. 5 is a top view of combinations of conductive regions of semiconductor structures in accordance with some embodiments of the present disclosure.

FIG. 5 is a top view of layouts 3a-3e of conductive regions of semiconductor structures 1a in accordance with some embodiments of the present disclosure. In some embodiments, the upper cells of the layout 3a include three conductive regions 90a-90c and the lower cells of the layout 3a include three conductive regions 90d-90f. In some embodiments, the conductive regions 90a-90f of the layout 3a are referred to as a zero metal layer (M0) or metal feature (M0). The conductive regions of the combinations 3b-3e are similar to the conductive regions of the layout 3a. In some embodiments, a conductive region 90a and a conductive region 90b are disposed at a fourth elevation above the first elevation. In some embodiments, two edges e1 and e2 of the conductive region 90a are misaligned with two edges e3 and e4 of the conductive region 90b. The area of the semiconductor structures may be reduced by using the conductive regions 90a-90f without effecting the functions of the semiconductor structures.

Figure 6:
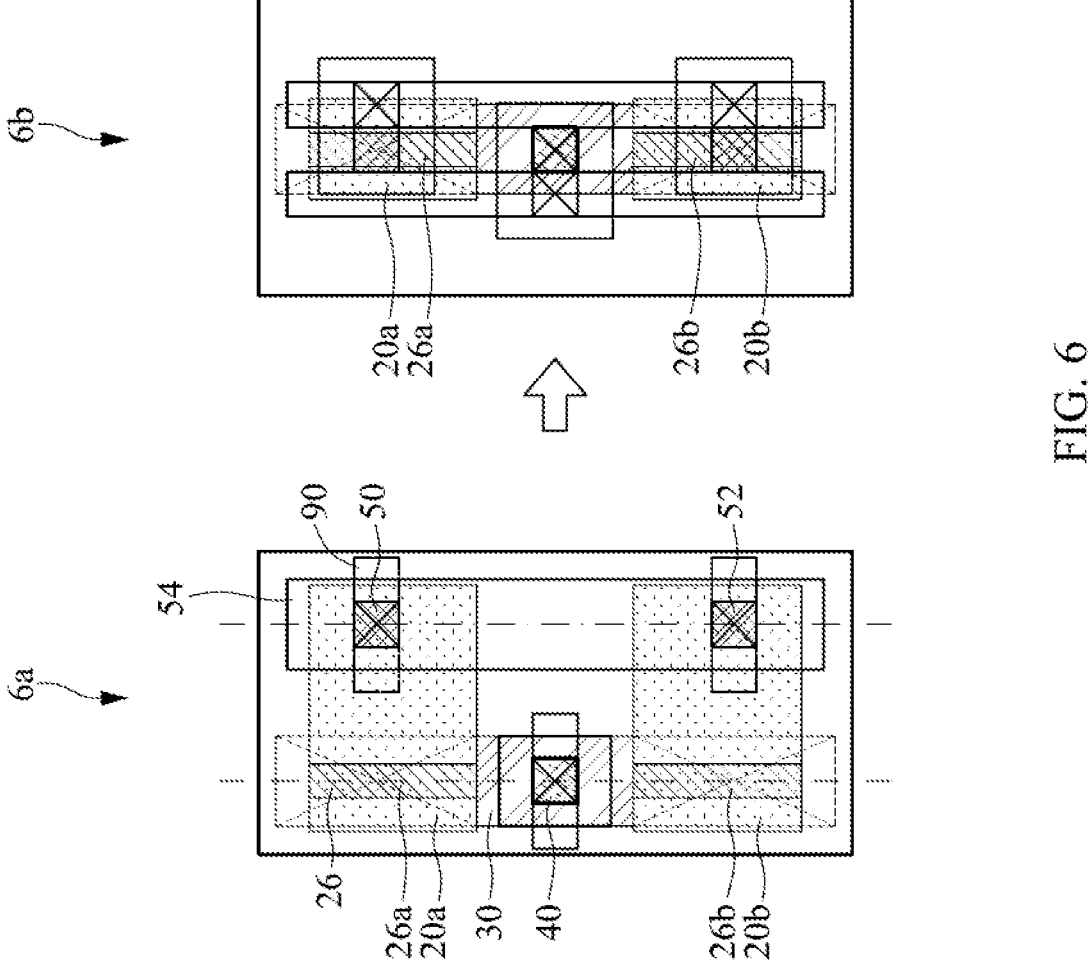
FIG. 6 is a schematic layout diagram of one cell of a portion of semiconductor structures in accordance with some embodiments of the present disclosure.

FIG. 6 is a schematic layout diagram of one cell 6a of a portion of semiconductor structures 1a in accordance with some embodiments of the present disclosure. In some embodiments, the cell 6a includes an upper source/drain contact 20, active/doped regions 26a and 26b, a conductive region layer 30, a conductive via 40, conductive via 50, conductive regions 90, and conductive vias 50, 52, and 54. The upper source/drain contact 20 includes upper source/drain contacts 20a and 20b. The active/doped regions 26 includes active/doped regions 26a and 26b. It should be noted that the terms "comprise" or "comprising," "include" or "including," "have" or "having," and the like used in this application are to be understood to be open-ended, i.e., to mean: including, but not limited to. Accordingly, various elements and/or structures, which are not shown in FIG. 6 and formed in the semiconductor structures 1a, are within the contemplated scope of the present disclosure.

In some embodiments, the cell 6a includes the first VFET structure 101 and the second VFET structure 102. The first VFET structure 101 includes an upper source/drain contact 20a. The second VFET structure 102 includes an upper source/drain contact 20b. In some embodiments, the first VFET structure 101 includes the active/doped region 26a and the second VFET structure 102 includes the active/doped region 26b. The projection area of the conductive region layer 30 is disposed between a projection area of the upper source/drain contact 20a and a projection area of the upper source/drain contact 20b. In some embodiments, the conductive region layer 30 is electrically connected to and in contact with metal gates 24a and 24b. The metal gate 24a is disposed below the upper source/drain contact 20a and the metal gate 24b is disposed below the upper source/drain contact 20b.

The cell 6a is a predesigned IC structure to be repeatedly used in individual IC designs. Effective IC design layouts include predesigned cell 6a and predefined rules for placing the cell 6a for enhanced circuit performance and reduced circuit areas. The cell 6a is repeatedly used in integrated circuit designs and therefore predesigned according to manufacturing technologies and saved in a standard cell library. IC designers retrieve the cell 6a from the standard cell library, incorporate it into their IC designs, and place it into the IC layout according to the predefined placing rules. The cell 6a includes various basic circuit devices, such as an inverter, AND, NAND, OR, XOR, and NOR, which are popular in digital circuit designs for applications, such as central processing unit (CPU), graphic processing unit (GPU), and system on chip (SOC) chip designs. The cell 6a includes other frequently used circuit blocks, such flip-flop circuit and latch.

The cell 6b includes a structure similar to the structure of the cell 6a, differing in the presence of two conductive regions 54, which also are referred to as a first metal layer (M1) or metal feature (M1). The two conductive regions 54 can be used to decrease the lateral width of the VFET structure 101. In some embodiments, the lateral width of the upper source/drain contact 20a of the cell 6b is less than the lateral width of the upper source/drain contact 20a of the cell 6a from a top view. The lateral width of upper source/drain contact 20b of the cell 6b is less than the lateral width of the upper source/drain contact 20b of the cell 6a from a top view. The work functions of the cell 6b are the same as those of the cell 6a. The area of the cell 6a can be changed or reduced to the area of the cell 6b without effecting the functions of the semiconductor structures. The number of the vertical metal layers may be reduced and the flexibility for designing the layout of the semiconductor structures can be improved.

Figure 7A:
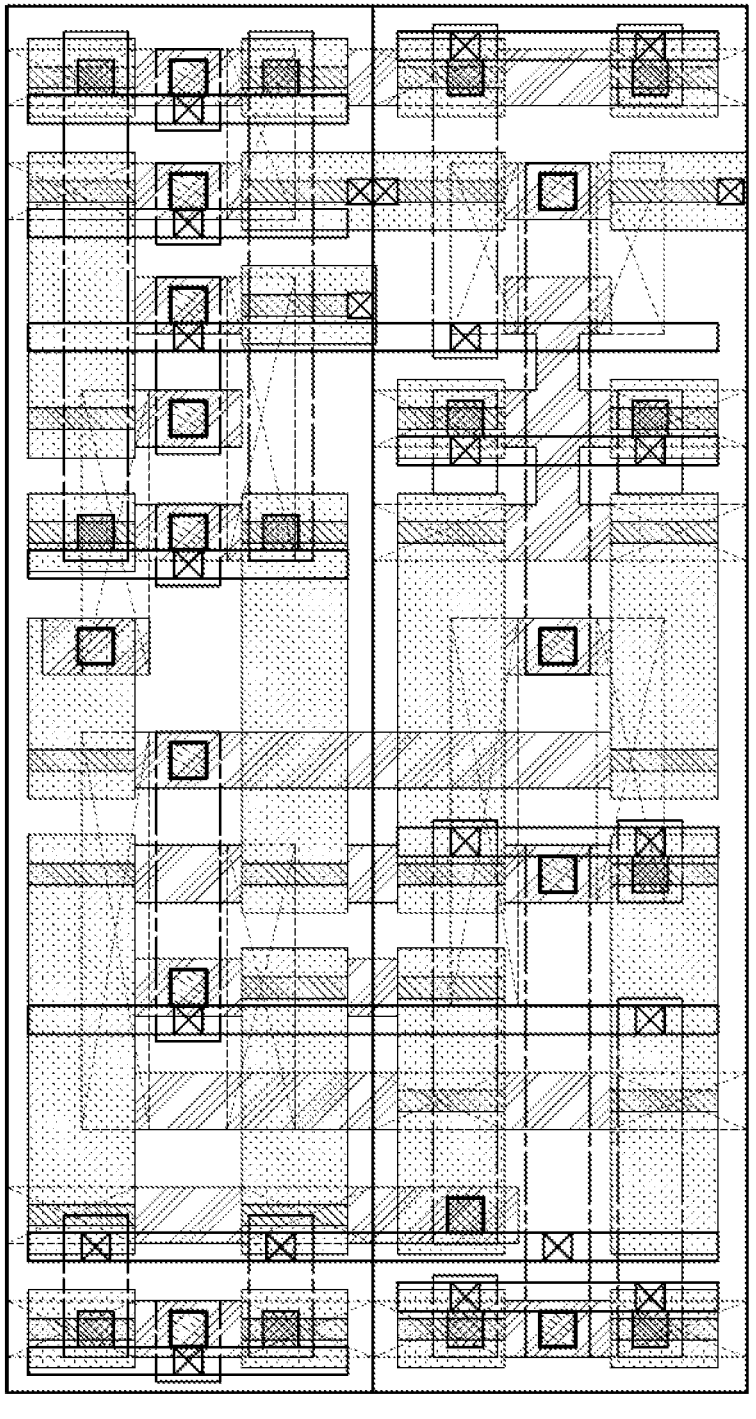
FIG. 7A is a schematic layout diagram of semiconductor structures in accordance with some embodiments of the present disclosure.
Figure 7A:
Figure 7A:
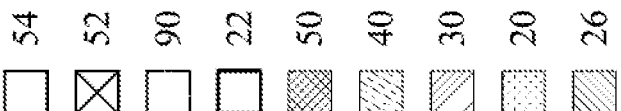

FIG. 7A is a schematic layout diagram of semiconductor structures 7a in accordance with some embodiments of the present disclosure. In some embodiments, semiconductor structures 7a include two rows of upper cells and two rows of lower cells. In some embodiments, the semiconductor structures 7a include a plurality of upper cells and a plurality of lower cells. In some embodiments, one cell may include one or two VFET structures. In some embodiments, one cell may include an upper source/drain contact 20, active/doped regions 26a and 26b, a conductive region layer 30, a conductive via 40, conductive via 50, conductive regions 90, conductive vias 50, 52, and 54. The upper source/drain layer 20 includes upper source/drain contacts 20a and 20b. The active/doped region layer 26 includes active/doped regions 26a and 26b. Accordingly, various elements and/or structures, which are not shown in FIG. 7A and formed in semiconductor structures 7a, are within the contemplated scope of the present disclosure.

The cells of the semiconductor structures 7a may be a predesigned IC structure to be repeatedly used in individual IC designs. Effective IC design layouts include various predesigned cells of the semiconductor structures 7a and predefined rules for placing the cells of the semiconductor structures 7a for enhanced circuit performance and reduced circuit areas. The cells of the semiconductor structures 7a are repeatedly used in integrated circuit designs and therefore predesigned according to manufacturing technologies and saved in a standard cell library. IC designers retrieve the cells of the semiconductor structures 7a from the standard cell library, incorporate it into their IC designs, and place it into the IC layout according to the predefined placing rules. The cell includes various basic circuit devices, such as an inverter, AND, NAND, OR, XOR, and NOR, which are popular in digital circuit designs for applications, such as central processing unit (CPU), graphic processing unit (GPU), and system on chip (SOC) chip designs. The cells of the semiconductor structures 7a may include other frequently used circuit blocks, such flip-flop circuit and latch.

Figure 7B:
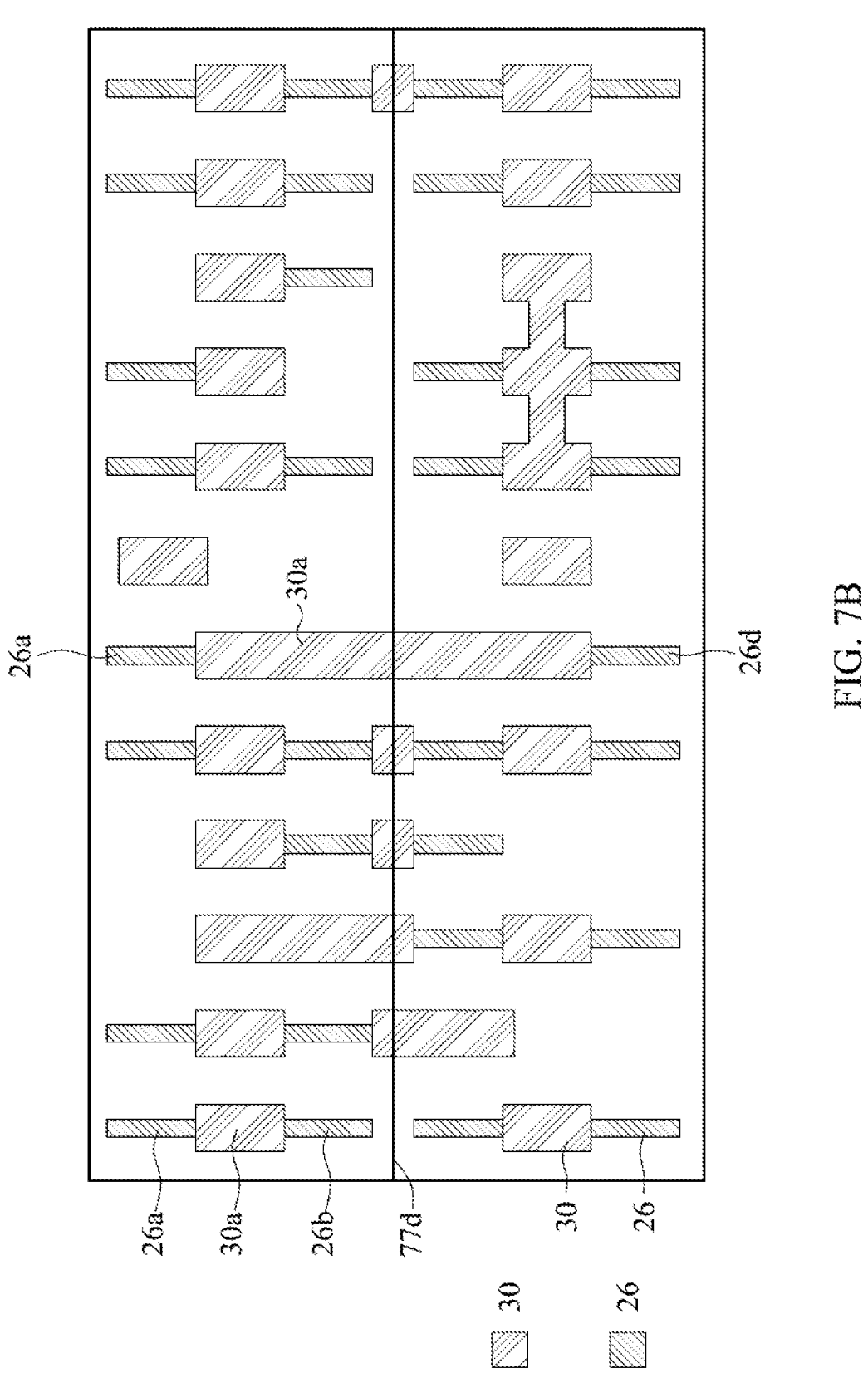
FIG. 7B is a schematic top view of a layout of semiconductor structures in accordance with some embodiments of the present disclosure.

FIG. 7B is a schematic top view 7b of a layout of semiconductor structures 7a in accordance with some embodiments of the present disclosure. In some embodiments, the schematic top view 7b respectively includes two rows of cells (including upper row and lower row). Some conductive regions of the conductive region layer 30 are disposed on the boundary 77d of the upper cells and lower cells of the semiconductor structures 7a from a top view. In some embodiments, the active/doped regions 26a of the semiconductor structures 7a are electrically connected to the active/doped region 26b of the semiconductor structures 7b through the conductive region 30a. In some embodiments, the active/doped region 26a of the semiconductor structures 7a is electrically connected to the active/doped region 26d of the semiconductor structures 7b through the conductive region 30a. In some embodiments, the active/doped region 26b of the second VFET structure 102 and the active/doped region 26a of the first VFET structure 101 are configured to be controlled by a conductive region 30b disposed between the first VFET structure 101 and the second VFET structure 102.

Figure 8A:
FIG. 8A is a schematic layout diagram of semiconductor structures in accordance with some embodiments of the present disclosure.
Figure 8A:

FIG. 8A is a schematic layout diagram of semiconductor structures 8a in accordance with some embodiments of the present disclosure. In some embodiments, semiconductor structures 8a include two rows of upper cells and two rows of lower cells. In some embodiments, the semiconductor structures 8a include a plurality of upper cells and a plurality of lower cells. In some embodiments, one cell may include one or two VFET structures. In some embodiments, one cell may include an upper source/drain contact 20, active/doped regions 26a and 26b, a conductive region layer 30, a conductive via 40, conductive via 50, conductive regions 90, and conductive vias 50, 52, and 54. The upper source/drain layer 20 includes upper source/drain contacts 20a and 20b. The active/doped region layer 26 includes active/doped regions 26a and 26b. Accordingly, various elements and/or structures, which are not shown in FIG. 8A and formed in the semiconductor structures 8a, are within the contemplated scope of the present disclosure.

The cells of the semiconductor structures 8a may be a predesigned IC structure to be repeatedly used in individual IC designs. Effective IC design layouts include various predesigned cells of the semiconductor structures 8a and predefined rules of placing the cells of the semiconductor structures 8a for enhanced circuit performance and reduced circuit areas. The cells of the semiconductor structures 8a are repeatedly used in integrated circuit designs and therefore predesigned according to manufacturing technologies and saved in a standard cell library. IC designers retrieve the cells of the semiconductor structures 8a from the standard cell library, incorporate it into their IC designs, and place it into the IC layout according to the predefined placing rules. The cell includes various basic circuit devices, such as an inverter, AND, NAND, OR, XOR, and NOR, which are popular in digital circuit designs for applications, such as central processing unit (CPU), graphic processing unit (GPU), and system on chip (SOC) chip designs. The cells of the semiconductor structures 8a may include other frequently used circuit blocks, such flip-flop circuit and latch.

Figure 8B:
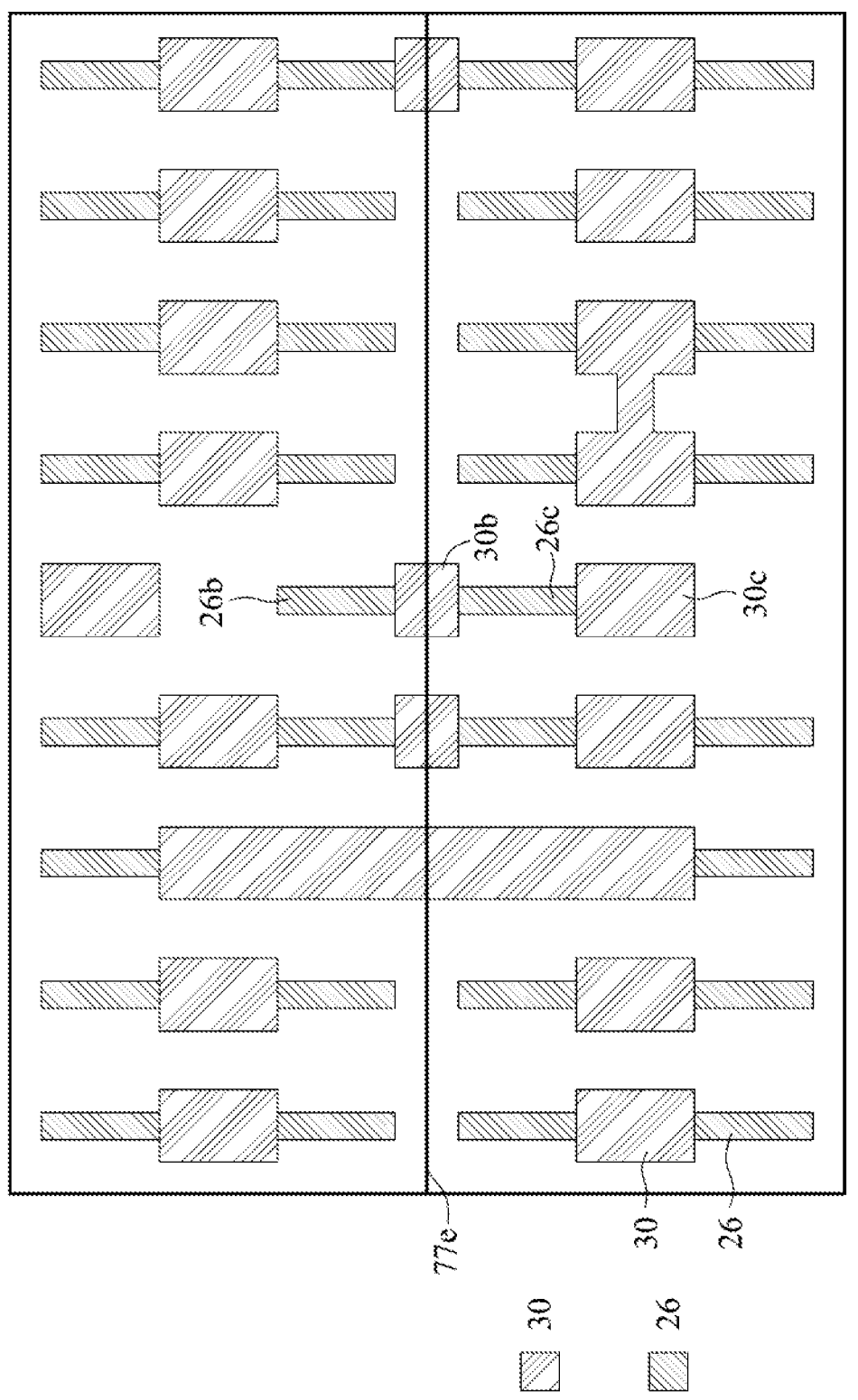
FIG. 8B is a schematic top view of a layout of semiconductor structures in accordance with some embodiments of the present disclosure.

FIG. 8B is a schematic top view 8b of a layout of semiconductor structures 8a in accordance with some embodiments of the present disclosure. In some embodiments, the schematic top view 8b respectively includes two rows of cells (including upper row and lower row). Some conductive regions of the conductive region layer 30 are disposed on the boundary 77e of the upper cells and lower cells of the semiconductor structures 7a from a top view. In some embodiments, the active/doped region 26a of the semiconductor structures 8a is electrically connected to the active/doped region 26b of the semiconductor structures 8b through the conductive region 30a. In some embodiments, the active/doped region 26a of the semiconductor structures 8a is electrically connected to the active/doped region 26d of the semiconductor structures 8b through the conductive region 30a. In some embodiments, the active/doped region 26*b* of the second VFET structure 102 and the active/doped region 26*c* of the third VFET structure 103 are configured to be controlled by a conductive region 30*b* disposed between the second VFET structure 102 and the third VFET structure 103.

Figure 8C:
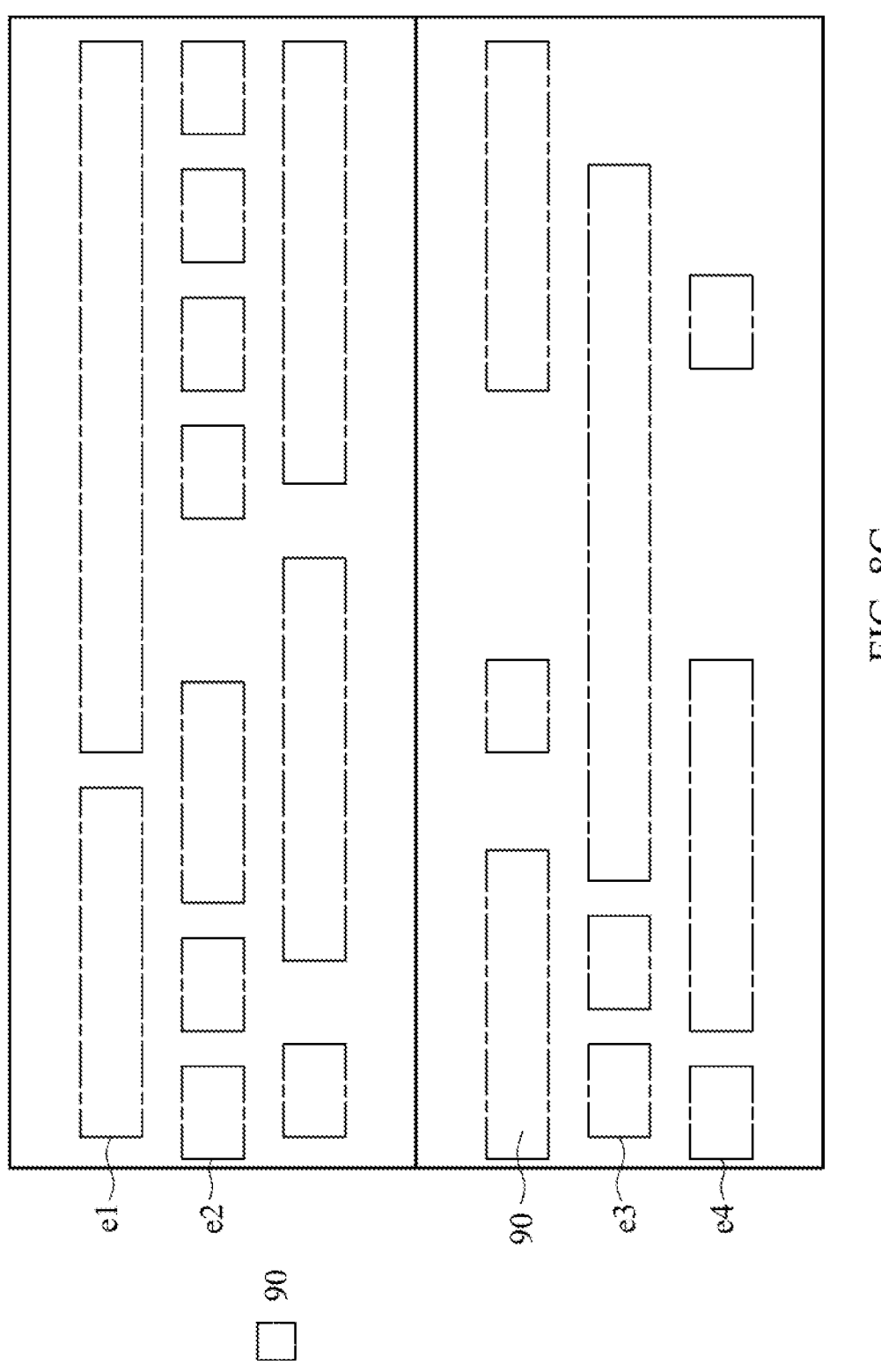
FIG. 8C is a top view of a combination of conductive regions of semiconductor structures in accordance with some embodiments of the present disclosure.

FIG. 8C is a top view of a combination 8*c* of conductive regions of semiconductor structures 8*a* in accordance with some embodiments of the present disclosure. In some embodiments, the upper cells of the combination 8*c* include a plurality of conductive regions and the lower cells of the combination 8*c* include a plurality of conductive regions. In some embodiments, the conductive region layer 90 of the combination 8*c* is referred to as a zero metal layer (M0) or metal feature (M0). In some embodiments, the conductive regions are disposed at a fourth elevation above the first elevation. In some embodiments, two edges e1 and e2 of the conductive regions are misaligned with each other. In some embodiments, the edge e2 of the conductive region is misaligned with the edge e3 of the conductive region.

FIG. 9A is a schematic layout diagram of semiconductor structures 9*a* in accordance with some embodiments of the present disclosure. In some embodiments, semiconductor structures 9*a* include two rows of upper cells and two rows of lower cells. In some embodiments, the semiconductor structures 9*a* include a plurality of upper cells and a plurality of lower cells. In some embodiments, one cell may include one or two VFET structures. In some embodiments, one cell may include an upper source/drain contact 20, active/doped regions 26*a* and 26*b*, a conductive region layer 30, a conductive via 40, conductive via 50, conductive regions 90, conductive vias 50, 52, and 54. The upper source/drain layer 20 includes upper source/drain contacts 20*a* and 20*b*. The active/doped region layer 26 includes active/doped regions 26*a* and 26*b*. Accordingly, various elements and/or structures, which are not shown in FIG. 9A and formed in the semiconductor structures 9*a*, are within the contemplated scope of the present disclosure.

The cells of the semiconductor structures 9*a* may be a predesigned IC structure to be repeatedly used in individual IC designs. Effective IC design layouts include various predesigned cells of the semiconductor structures 9*a* and predefined rules of placing the cells of the semiconductor structures 9*a* for enhanced circuit performance and reduced circuit areas. The cells of the semiconductor structures 9*a* are repeatedly used in integrated circuit designs and therefore predesigned according to manufacturing technologies and saved in a standard cell library. IC designers retrieve the cells of the semiconductor structures 9*a* from the standard cell library, incorporate it into their IC designs, and place it into the IC layout according to the predefined placing rules. The cell includes various basic circuit devices, such as an inverter, AND, NAND, OR, XOR, and NOR, which are popular in digital circuit designs for applications, such as central processing unit (CPU), graphic processing unit (GPU), and system on chip (SOC) chip designs. The cells of the semiconductor structures 9*a* may include other frequently used circuit blocks, such flip-flop circuit and latch.

Figure 9B:
FIG. 9B is a schematic top view of a layout of semiconductor structures in accordance with some embodiments of the present disclosure.
Figure 9B:
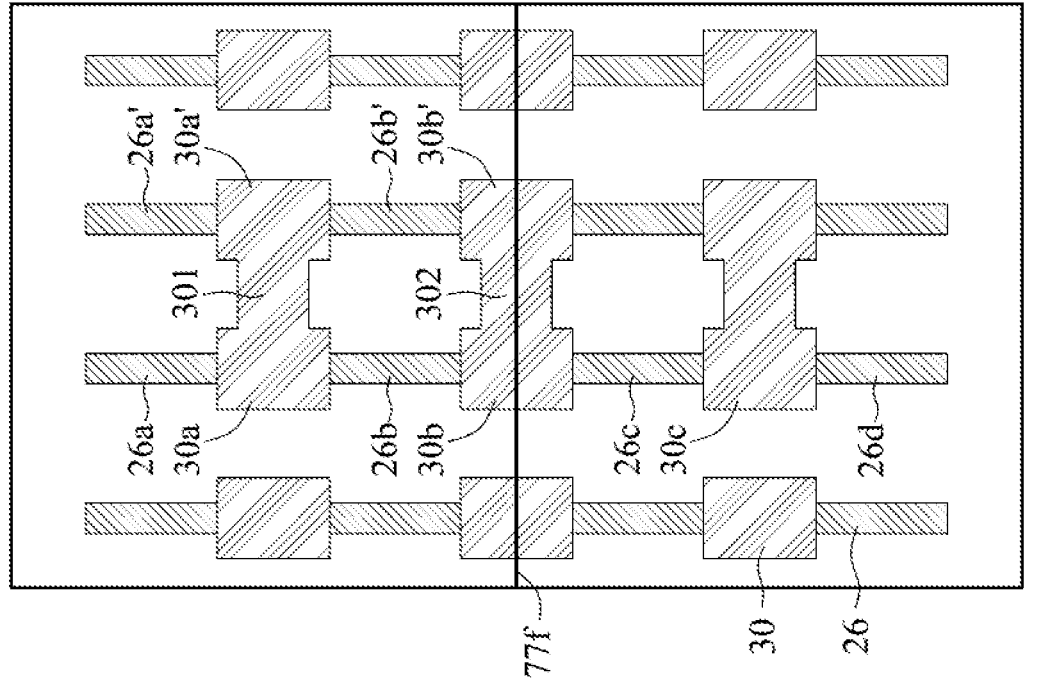
Figure 9B:
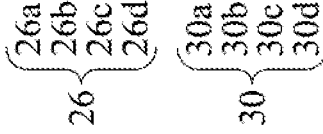
Figure 9B:
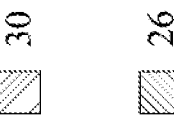

FIG. 9B is a schematic top view 9*b* of a layout of semiconductor structures 9*a* in accordance with some embodiments of the present disclosure. In some embodiments, the schematic top view 9*b* respectively includes two rows of cells (including upper row and lower row). The conductive region layers 30*b* and 30*b*' are disposed on the boundary 77*f* of the upper cells and lower cells of the semiconductor structures 9*a* from a top view. The conductive region layer 30*a* contacts and is electrically connected to the conductive region layer 30*a*' through metal feature

301. The conductive region layer 30*b* contacts and is electrically connected to the conductive region layer 30*b*' through metal feature 302. The material of the metal features 301 and 302 is the same as the material of the conductive region layers 30*a*, 30*a*', 30*b* and 30*b*'. In some embodiments, the active/doped region 26*a* of the semiconductor structures 9*a* is electrically connected to the active/doped region 26*b* of the semiconductor structures 9*b* through the conductive region 30*a*. In some embodiments, the active/doped region 26*b* of the semiconductor structures 9*b* is electrically connected to the active/doped region 26*c* of the semiconductor structures 9*b* through the conductive region 30*b*. In some embodiments, the active/doped region 26*b* and the active/doped region 26*c* is configured to be controlled by a conductive region 30*b*.

Figure 9C:
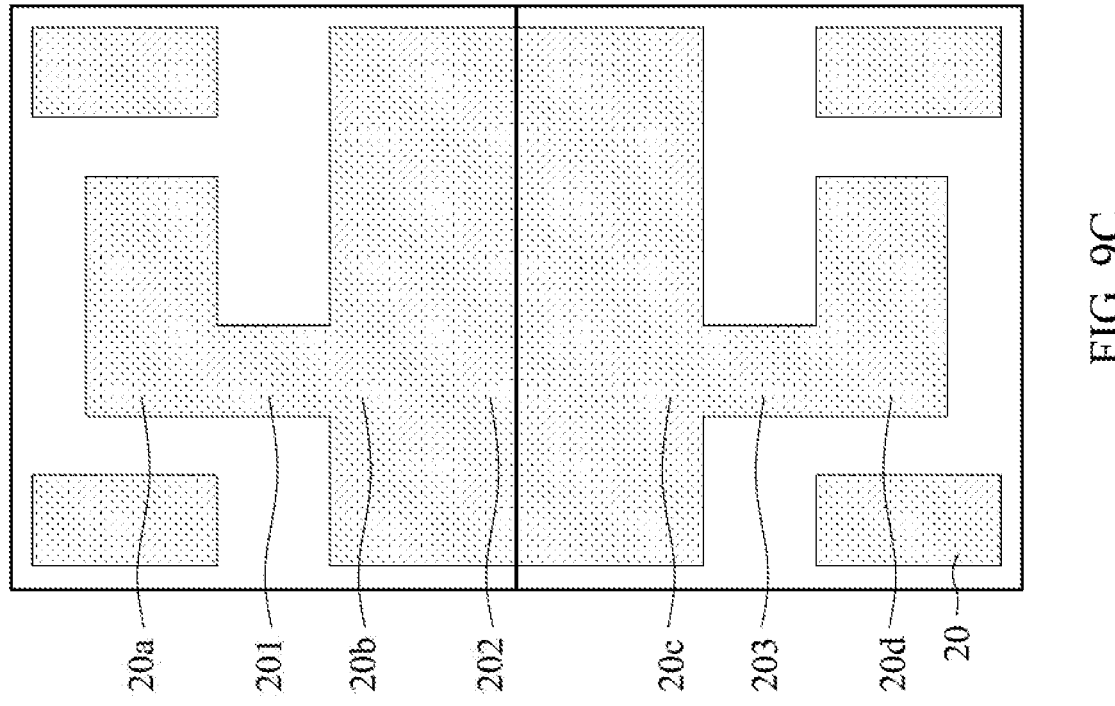
FIG. 9C is a top view of a combination of upper source/drain layer of semiconductor structures in accordance with some embodiments of the present disclosure.
Figure 9C:
Figure 9C:
Figure 9C:

FIG. 9C is a top view 9*c* of a combination of upper source/drain contact 20 of semiconductor structures 9*b* in accordance with some embodiments of the present disclosure. In some embodiments, the upper source/drain contacts 20 include at least four upper source/drain contacts 20*a*-20*d*. In some embodiments, the upper source/drain contact 20*a* contacts the upper source/drain contact 20*b* through metal feature 201. The upper source/drain contact 20*b* contacts the upper source/drain contact 20*c* through metal feature 202. The upper source/drain contact 20*c* contacts the upper source/drain contact 20*d* from a top view through metal feature 203. The material of the metal features 201-203 is the same as the material of the upper source/drain contacts 20*a*-20*d*.

Figure 10:
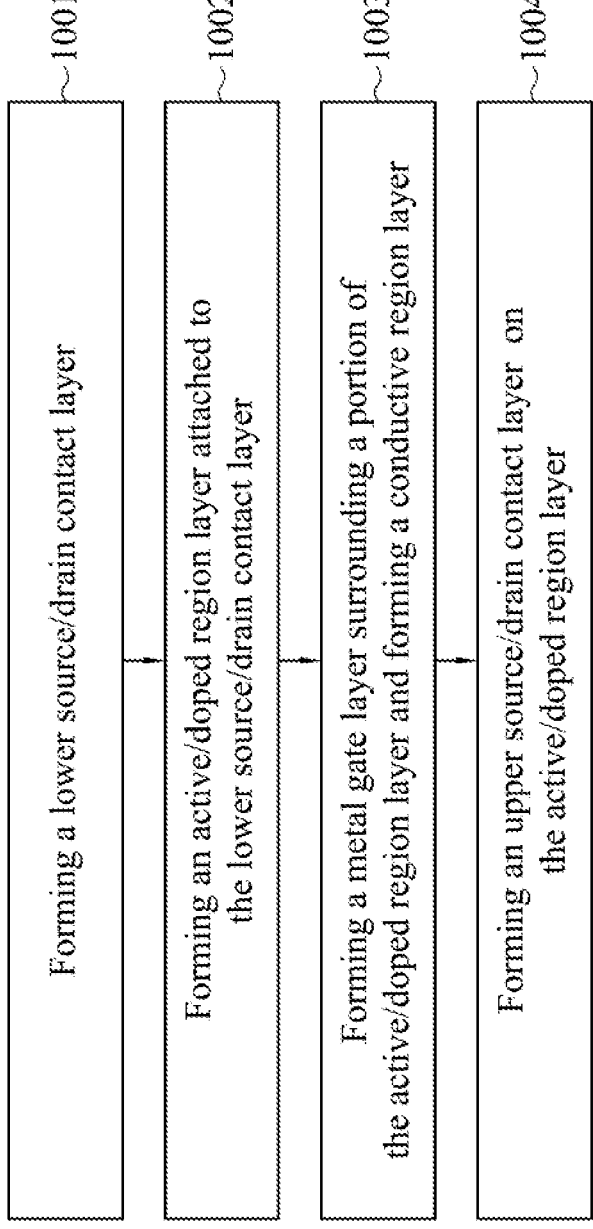
FIG. 10 is a flowchart of an embodiment of a method of manufacturing semiconductor structures in accordance with some embodiments of the present disclosure.

FIG. 10 is a flowchart of an embodiment of a method 1000 of manufacturing semiconductor structures in accordance with some embodiments of the present disclosure. In some embodiments, the method may include various operations for manufacturing the semiconductor structures 1*a*. The method 1000 includes forming a lower source/drain contact layer (operation 1001). The method 1000 includes forming an active/doped region layer attached to the lower source/drain contact layer (operation 1002). The method 1000 includes forming a metal gate layer surrounding a portion of the active/doped region layer, and forming a conductive region layer (operation 1003). The metal gate 24*a* is made of conductive material, such as aluminum (Al), copper (Cu), tungsten (W), titanium (Ti), tantalum (Ta), or other applicable materials. The method 1000 includes forming an upper source/drain contact layer on the active/doped region layer (operation 1004). It should be noted that the method of manufacturing semiconductor structures in accordance with some embodiments of the present disclosure includes, but not limited to, the mentioned processes.

According to some embodiments, a semiconductor structure includes a first upper source/drain region, a second upper source/drain contact, a first lower source/drain contact, a second lower source/drain contact, and a third conductive region. The first upper source/drain contact is disposed at a first elevation. The second upper source/drain contact is disposed at the first elevation. The first lower source/drain contact is disposed at a second elevation. The second lower source/drain contact is disposed at the second elevation. The third conductive region is disposed at a third elevation. A projection area of the third conductive region is disposed between a projection area of the first upper source/drain contact and a projection area of the second upper source/drain contact. The third elevation is disposed between the first elevation and the second elevation.

According to other embodiments, a semiconductor structure includes a first VFET structure, a second VFET structure, and a third VFET structure. The first VFET structure comprises a first upper source/drain contact. The second VFET structure is adjacent to the first VFET structure. The second VFET structure comprises a second upper source/drain contact. A projection area of the third conductive region is disposed between a projection area of the first upper source/drain contact and a projection area of the second upper source/drain contact. An elevation of the third conductive region is disposed below an elevation of the first upper source/drain contact and the second upper source/drain contact.

According to some embodiments, a semiconductor structure comprises a first VFET structure, a second VFET structure, a third VFET structure, and a fourth VFET structure. The first VFET structure comprises a first upper source/drain contact. The second VFET structure is adjacent to the first VFET structure. The second VFET structure comprises a second upper source/drain contact. The third VFET structure is adjacent to the second VFET structure. The third VFET structure comprises a third upper source/drain contact. The fourth VFET structure is adjacent to the third VFET structure. The fourth VFET structure comprises a fourth upper source/drain contact. The first upper source/drain contact contacts the second upper source/drain contact. The second upper source/drain contact contacts the third upper source/drain contact. The third upper source/drain contact contacts the fourth upper source/drain contact from a top view.

The methods and features of the present disclosure have been sufficiently described in the examples and descriptions provided. It should be understood that any modifications or changes without departing from the spirit of the present disclosure are intended to be covered in the protection scope of the present disclosure.

Moreover, the scope of the present application is not intended to be limited to the particular embodiments of the process, machine, manufacture, and composition of matter, means, methods and steps described in the specification. As those skilled in the art will readily appreciate from the present disclosure, processes, machines, manufacture, composition of matter, means, methods or steps presently existing or later to be developed, that perform substantially the same function or achieve substantially the same result as the corresponding embodiments described herein, may be utilized according to the present disclosure.

Accordingly, the appended claims are intended to include within their scope: processes, machines, manufacture, compositions of matter, means, methods or steps. In addition, each claim constitutes a separate embodiment, and the combination of various claims and embodiments are within the scope of the present disclosure.

What is claimed is:

1. A semiconductor structure comprising:
a first upper source/drain contact disposed at a first elevation;
a second upper source/drain contact disposed at the first elevation;
a first lower source/drain contact disposed at a second elevation;
a second lower source/drain contact disposed at the second elevation; and
a third conductive region disposed at a third elevation, wherein a projection area of the third conductive region is disposed between a projection area of the first upper source/drain contact and a projection area of the second upper source/drain region, and wherein the third elevation is disposed between the first elevation and the second elevation.

2. The semiconductor structure of claim 1, further comprising a first vertical field effect transistor (VFET) structure, wherein the first VFET structure comprises the first upper source/drain contact and the first lower source/drain contact.

3. The semiconductor structure of claim 2, wherein the first VFET structure further comprises an active/doped region in contact with the first upper source/drain contact and the first lower source/drain contact.

4. The semiconductor structure of claim 1, wherein the projection area of the third conductive region is disposed between a projection area of the first lower source/drain contact and a projection area of the second lower source/drain contact.

5. The semiconductor structure of claim 3, further comprising a metal gate layer disposed at the third elevation, wherein the metal gate layer contacts the active/doped region and surrounds a portion of the active/doped region.

6. The semiconductor structure of claim 5, wherein the metal gate layer contacts and is electrically connected to the third conductive region.

7. The semiconductor structure of claim 6, further comprising a second VFET structure adjacent to the first VFET structure, wherein the second VFET structure comprises the second upper source/drain contact and the second lower source/drain contact, wherein the second VFET structure and the first VFET structure are in contact with the third conductive region.

8. The semiconductor structure of claim 7, further comprising a third VFET structure adjacent to the second VFET structure, wherein the second VFET structure and the third VFET structure are configured to be controlled by a fourth conductive region between the third VFET structure and the second VFET structure.

9. The semiconductor structure of claim 1, wherein the first upper source/drain contact overlaps with the first lower source/drain contact from a top view.

10. The semiconductor structure of claim 1, further comprising:
a second VFET structure adjacent to the first VFET structure, wherein the second VFET structure comprises a second upper source/drain contact;
a third VFET structure adjacent to the second VFET structure, wherein the third VFET structure comprises a third upper source/drain contact; and
a fourth VFET structure adjacent to the third VFET structure, wherein the fourth VFET structure comprises a fourth upper source/drain contact;
wherein the first upper source/drain contact contacts the second upper source/drain contact, wherein the second upper source/drain contact contacts the third upper source/drain contact, and wherein the third upper source/drain contact contacts the fourth upper source/drain contact from a top view.

11. The semiconductor structure of claim 10, wherein at least two of a first lateral width of the first upper source/drain contact, a second lateral width of the second upper source/drain contact, a third lateral width of the third upper source/drain contact, and a fourth lateral width of the fourth upper source/drain contact are different from each other from a top view.

12. The semiconductor structure of claim 1, further comprising a fifth conductive region and a sixth conductive region disposed at a fourth elevation above the first elevation, wherein two edges of the fifth conductive region are misaligned with two edges of the sixth conductive region.

13. A semiconductor structure comprising:

a first VFET structure, wherein the first VFET structure comprises a first upper source/drain contact;

a second VFET structure adjacent to the first VFET structure, wherein the second VFET structure comprises a second upper source/drain contact; and a third conductive region, wherein a projection area of the third conductive region is disposed between a projection area of the first upper source/drain contact and a projection area of the second upper source/drain contact, wherein an elevation of the third conductive region is disposed below an elevation of the first upper source/drain contact and the second upper source/drain contact, wherein the first VFET structure further comprises an active/doped region and a first lower source/drain contact, wherein the active/doped region contacts the first upper source/drain contact and the first lower source/drain contact, wherein a third elevation layer comprises a metal gate layer, wherein the metal gate layer contacts the active/doped region and surrounds a portion of the active/doped region.

14. The semiconductor structure of claim 13, wherein the first upper source/drain contact is disposed at a first elevation and the first lower source/drain contact is disposed at a second elevation, wherein the first upper source/drain contact overlaps with the first lower source/drain contact from a top view.

15. The semiconductor structure of claim 14, wherein the first VFET structure further comprises an oxide diffusion region in contact with the first upper source/drain contact and the first lower source/drain contact.

16. The semiconductor structure of claim 15, further comprising:

a third VFET structure adjacent to the second VFET structure, wherein the third VFET structure comprises a third upper source/drain contact; and a fourth VFET structure adjacent to the third VFET structure, wherein the fourth VFET structure comprises a fourth upper source/drain contact;

wherein the first upper source/drain contact contacts the second upper source/drain contact, wherein the second upper source/drain contact contacts the third upper source/drain contact, and wherein the third upper source/drain contact contacts the fourth upper source/drain contact from a top view.

17. A semiconductor structure comprising:

a first VFET structure, wherein the first VFET structure comprises a first upper source/drain contact;

a second VFET structure adjacent to the first VFET structure, wherein the second VFET structure comprises a second upper source/drain contact;

a third VFET structure adjacent to the second VFET structure, wherein the third VFET structure comprises a third upper source/drain contact;

a fourth VFET structure adjacent to the third VFET structure, wherein the fourth VFET structure comprises a fourth upper source/drain contact; and wherein the first upper source/drain contact contacts the second upper source/drain contact, wherein the second upper source/drain contact contacts the third upper source/drain contact, and wherein the third upper source/drain contact contacts the fourth upper source/drain contact from a top view.

18. The semiconductor structure of claim 17, further comprising a third elevation layer, wherein an elevation of the third elevation layer is disposed below an elevation of the first upper source/drain contact.

19. The semiconductor structure of claim 18, wherein the third elevation layer comprises a third conductive region, wherein a projection area of the third conductive region is disposed between a projection area of the first upper source/drain contact and a projection area of the second upper source/drain contact.

20. The semiconductor structure of claim 19, wherein the first VFET structure comprises a first lower source/drain contact and an active/doped region, wherein the active/doped region contacts the first upper source/drain contact and the first lower source/drain contact.

* * * * *